United States Patent
Kwon et al.

(10) Patent No.: US 9,830,856 B2
(45) Date of Patent: Nov. 28, 2017

(54) STAGE CIRCUIT INCLUDING A CONTROLLER, DRIVERS, AND OUTPUT UNITS AND SCAN DRIVER USING THE SAME

(71) Applicants: Samsung Display Co., Ltd., Yongin-si, Gyeonggi-do (KR); Industry-University Cooperation Foundation Hanyang-University, Seoul (KR)

(72) Inventors: Oh-Kyong Kwon, Seoul (KR); Yeong-Keun Kwon, Yongin-si (KR); Jong-Hee Kim, Yongin-si (KR); Ji-Sun Kim, Yongin-si (KR); Jae-Keun Lim, Yongin-si (KR); Chong-Chul Chai, Yongin-si (KR)

(73) Assignees: Samsung Display Co., Ltd., Yongin-si (KR); Industry-University Cooperation Foundation Hanyang-University, Seoul (KR)

( * ) Notice: Subject to any disclaimer, the term of this patent is extended or adjusted under 35 U.S.C. 154(b) by 0 days.

(21) Appl. No.: 15/351,358

(22) Filed: Nov. 14, 2016

(65) Prior Publication Data
US 2017/0061874 A1    Mar. 2, 2017

Related U.S. Application Data

(62) Division of application No. 14/456,976, filed on Aug. 11, 2014, now Pat. No. 9,524,674.

(30) Foreign Application Priority Data

Aug. 12, 2013 (KR) .......................... 10-2013-0095210

(51) Int. Cl.
*G06F 3/038*    (2013.01)
*G09G 5/00*    (2006.01)
(Continued)

(52) U.S. Cl.
CPC ......... *G09G 3/3225* (2013.01); *G09G 3/3266* (2013.01); *G09G 2310/0264* (2013.01);
(Continued)

(58) Field of Classification Search
CPC ..................... G09G 3/3266; G09G 2310/0286
See application file for complete search history.

(56) References Cited

U.S. PATENT DOCUMENTS 8,587,347 B2   11/2013 Yoon et al.
2008/0117157 A1   5/2008 Hwang et al.
(Continued)

FOREIGN PATENT DOCUMENTS

KR    10-2012-0065788    6/2012
KR    10-2013-0003252    1/2013
(Continued)

OTHER PUBLICATIONS

Yoo, Seung-Jin et al., "Low Power Consumption Shift Register Using Depletion Mode Amorphous In—Ga—Zn—O TFTs", International Meeting on Information Display Digest, 2011, pp. 84-85.

*Primary Examiner* — Kwang-Su Yang
(74) *Attorney, Agent, or Firm* — Lewis Roca Rothgerber Christie LLP (57) ABSTRACT

A stage circuit includes a first driver, a second driver, a first output unit, a second output unit and a controller. The first driver controls voltages of first and second nodes, according to a first power source, a third power source, a start signal or a carry signal of a previous stage input to a first input terminal, and a clock signal supplied to a second input terminal. The second driver controls voltages of third and fourth nodes, according to voltages of the first power source, the third power source, the first input terminal and the first and second nodes. The first output unit outputs a carry signal to a first output terminal, according to voltages of the first
(Continued)

power source, the second input terminal and the third and fourth nodes. The second output unit outputs a scan signal to a second output terminal, according to voltages of the second power source, the second input terminal and the third and fourth nodes. The controller is electrically coupled to the first output terminal and the second driver.

13 Claims, 9 Drawing Sheets

(51) Int. Cl.
*G09G 3/3225* (2016.01)
*G09G 3/3266* (2016.01)
*G11C 19/28* (2006.01)

(52) U.S. Cl.
CPC . *G09G 2310/0289* (2013.01); *G09G 2310/08* (2013.01); *G11C 19/28* (2013.01)

(56) References Cited

U.S. PATENT DOCUMENTS

| | | | |
|---|---|---|---|
| 2011/0122117 | A1* | 5/2011 | Lee ...................... G09G 3/3677 345/211 |
| 2012/0038609 | A1 | 2/2012 | Chung |
| 2012/0146978 | A1 | 6/2012 | Park et al. |
| 2013/0002340 | A1 | 1/2013 | Chung et al. |
| 2013/0141318 | A1 | 6/2013 | Kim et al. |
| 2014/0003571 | A1 | 1/2014 | Yamamura |
| 2014/0091997 | A1 | 4/2014 | Han et al. |
| 2014/0092078 | A1 | 4/2014 | Yoon et al. |
| 2015/0154928 | A1 | 6/2015 | Abe et al. |

FOREIGN PATENT DOCUMENTS

| | | |
|---|---|---|
| KR | 10-2013-0028274 | 3/2013 |
| KR | 10-2014-0042308 | 4/2014 |

\* cited by examiner

STAGE CIRCUIT INCLUDING A CONTROLLER, DRIVERS, AND OUTPUT UNITS AND SCAN DRIVER USING THE SAME

CROSS-REFERENCE TO RELATED APPLICATION

This application is a divisional of U.S. patent application Ser. No. 14/456,976, filed Aug. 11, 2014, which claims priority to and the benefit of Korean Patent Application No. 10-2013-0095210, filed Aug. 12, 2013, the entire content of both of which is incorporated herein by reference.

BACKGROUND

1. Field

Embodiments of the present invention relate to a stage circuit and a scan driver using the same.

2. Description of the Related Art

With the recent developments in information technologies, the importance of a display device that is a medium for presenting information has been increasing. Accordingly, flat panel display devices (FPD devices) such as liquid crystal display (LCD) devices, organic light emitting diode (OLED) display devices and plasma display panel (PDP) devices are being increasingly used.

Among these FPD devices, the OLED display device displays images using organic light emitting diodes (OLED) that emit light through recombination of electrons and holes. The organic light emitting display device has a fast response speed and is driven with low power consumption.

SUMMARY

Embodiments provide a stage circuit and a scan driver using the same, which can improve the reliability of driving an OLED display device.

According to an embodiment of the present invention, there is provided a stage circuit, including: a first driver configured to control voltages of first and second nodes, according to a first power source, a third power source, a start signal or a carry signal of a previous stage input to a first input terminal, and a clock signal supplied to a second input terminal; a second driver configured to control voltages of third and fourth nodes, according to voltages of the first power source, the third power source, the first input terminal and the first and second nodes; a first output unit configured to output a carry signal to a first output terminal, according to voltages of the first power source, the second input terminal and the third and fourth nodes; a second output unit configured to output a scan signal to a second output terminal, according to voltages of the second power source, the second input terminal and the third and fourth nodes; and a controller electrically coupled to the first output terminal and the second driver.

The first driver, the second driver, the first output unit, the second output unit and the controller may be configured with N-type transistors.

The first and second power sources may have a gate-off voltage, and the third power source may have a gate-on voltage.

The second power source may have a voltage higher than that of the first power source.

The second output unit may include a first transistor coupled between the second input terminal and the second output terminal, the first transistor having a gate electrode coupled to the third node; and a second transistor coupled between the second output terminal and the second power source, the second transistor having a gate electrode coupled to the fourth node.

The first output unit may include a third transistor coupled between the second input terminal and the first output terminal, the third transistor having a gate electrode coupled to the third node; a fourth transistor coupled between the first output terminal and the first power source, the fourth transistor having a gate electrode coupled to the fourth node; and a capacitor coupled between the first output terminal and the third node.

The first driver may include a fifth transistor coupled between the third power source and the first node, the fifth transistor having a gate electrode coupled to the third power source; a sixth transistor coupled between the first node and the first power source, the sixth transistor having a gate electrode coupled to the first input terminal; a seventh transistor coupled between the third power source and the second node, the seventh transistor having a gate electrode coupled to the first input terminal; an eighth transistor coupled between the second node and a ninth transistor, the eighth transistor having a gate electrode coupled to the first node; and the ninth transistor coupled between the eighth transistor and the first power source, the ninth transistor having a gate electrode coupled to the second input terminal.

The fifth transistor may have a channel length longer than that of the sixth transistor.

The eighth transistor may include a plurality of transistors coupled in series.

The second driver may include a tenth transistor coupled between the third power source and an eleventh transistor, the tenth transistor having a gate electrode coupled to the second node; the eleventh transistor coupled between the tenth transistor and the third node, the eleventh transistor having a gate electrode coupled to the first node; a twelfth transistor coupled between the third node and a thirteenth transistor, the twelfth transistor having a gate electrode coupled to the first input terminal; the thirteenth transistor coupled between the twelfth transistor and the first power source, the thirteenth transistor having a gate electrode coupled to the first input terminal; a fourteenth transistor coupled between the third node and a fifteenth transistor, the fourteenth transistor having a gate electrode coupled to the fourth node; the fifteenth transistor coupled between the fourteenth transistor and the first power source, the fifteenth transistor having a gate electrode coupled to the fourth node; a sixteenth transistor coupled between the third power source and the fourth node, the sixteenth transistor having a gate electrode coupled to the third power source; a seventeenth transistor coupled between the fourth node and the first power source, the seventeenth transistor having a gate electrode coupled to the second node; and an eighteenth transistor coupled between the fourth node and the first power source, the eighteenth transistor having a gate electrode coupled to the first output terminal.

The sixteenth transistor may have a channel length longer than that of the seventeenth or eighteenth transistor.

The controller may include a nineteenth transistor coupled between the first output terminal and a common node of the twelfth and thirteenth transistors, and the nineteenth transistor having a gate electrode coupled to the first output terminal; and a twentieth transistor coupled between the first output terminal and a common node of the fourteenth and fifteenth transistors, and the twentieth transistor having a gate electrode coupled to the first output terminal.

The controller may allow at least one transistor included in the second driver to be completely turned off during a period in which the carry signal is supplied.

According to an embodiment of the present invention, there is provided a scan driver, including: stage circuits respectively coupled to scan lines to supply scan signals to scan lines, the stage circuits being driven by one clock signal, wherein each of the stage circuits includes a first input terminal configured to receive a start signal or a carry signal of a previous stage, a second input terminal configured to receive the clock signal, a first output terminal configured to output a carry signal, and a second output terminal configured to output a scan signal.

The clock signal may repeat high and low levels, and the supply period of the high level may be set longer than that of the low level.

The start signal may be input to the first input terminal of a first stage circuit, and the carry signal of the previous stage may be input to the first input terminals of the other stage circuits.

The start signal may overlap with the high level of the clock signal.

The stage circuits may include N-type transistors.

Each stage circuit may include a first driver coupled to a first power source, a third power source, the first input terminal and the second input terminal to control voltages of first and second nodes; a second driver configured to control voltages of third and fourth nodes, according to voltage of the first power source, the third power source, the first input terminal and the first and second nodes; a first output unit configured to output the carry signal to the first output terminal, according to voltages of the first power source, the second input terminal and the third and fourth nodes; a second output unit configured to output a scan signal to the second output terminal, according to voltages of the second power source, the second input terminal and the third and fourth nodes; and a controller electrically coupled to the first output terminal and the second driver.

The first and second power sources may have a gate-off voltage, and the third power source may have a gate-on voltage.

The second power source may have a voltage higher than that of the first power source.

The second output unit may include a first transistor coupled between the second input terminal and the second output terminal, the first transistor having a gate electrode coupled to the third node; and a second transistor coupled between the second output terminal and the second power source, the second transistor having a gate electrode coupled to the fourth node.

The first output unit may include a third transistor coupled between the second input terminal and the first output terminal, the third transistor having a gate electrode coupled to the third node; a fourth transistor coupled between the first output terminal and the first power source, the fourth transistor having a gate electrode coupled to the fourth node; and a capacitor coupled between the first output terminal and the third node.

The first driver may include a fifth transistor coupled between the third power source and the first node, the fifth transistor having a gate electrode coupled to the third power source; a sixth transistor coupled between the first node and the first power source, the sixth transistor having a gate electrode coupled to the first input terminal; a seventh transistor coupled between the third power source and the second node, the seventh transistor having a gate electrode coupled to the first input terminal; an eighth transistor coupled between the second node and a ninth transistor, the eighth transistor having a gate electrode coupled to the first node; and the ninth transistor coupled between the eighth transistor and the first power source, the ninth transistor having a gate electrode coupled to the second input terminal.

The fifth transistor may have a channel length longer than that of the sixth transistor.

The second driver may include a tenth transistor coupled between the third power source and an eleventh transistor, the tenth transistor having a gate electrode coupled to the second node; the eleventh transistor coupled between the tenth transistor and the third node, the eleventh transistor having a gate electrode coupled to the first node; a twelfth transistor coupled between the third node and a thirteenth transistor, the twelfth transistor having a gate electrode coupled to the first input terminal; the thirteenth transistor coupled between the twelfth transistor and the first power source, the thirteenth transistor having a gate electrode coupled to the first input terminal; a fourteenth transistor coupled between the third node and a fifteenth transistor, the fourteenth transistor having a gate electrode coupled to the fourth node; the fifteenth transistor coupled between the fourteenth transistor and the first power source, the fifteenth transistor having a gate electrode coupled to the fourth node; a sixteenth transistor coupled between the third power source and the fourth node, the sixteenth transistor having a gate electrode coupled to the third power source; a seventeenth transistor coupled between the fourth node and the first power source, the seventeenth transistor having a gate electrode coupled to the second node; and an eighteenth transistor coupled between the fourth node and the first power source, the eighteenth transistor having a gate electrode coupled to the first output terminal.

The sixteenth transistor may have a channel length longer than that of the seventeenth or eighteenth transistor.

The controller may include a nineteenth transistor coupled between the first output terminal and a common node of the twelfth and thirteenth transistors, and the nineteenth transistor having a gate electrode coupled to the first output terminal; and a twentieth transistor coupled between the first output terminal and a common node of the fourteenth and fifteenth transistors, and the twentieth transistor having a gate electrode coupled to the first output terminal.

BRIEF DESCRIPTION OF THE DRAWINGS

Example embodiments will be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Hereinafter, certain exemplary embodiments according to the present invention will be described with reference to the accompanying drawings. Here, when a first element is described as being coupled to a second element, the first element may be directly coupled to the second element or may be indirectly coupled to the second element via a third element. Further, some of the elements that are not essential to the complete understanding of the invention are omitted for clarity. Also, like reference numerals refer to like elements throughout.

Expressions such as "at least one of," when preceding a list of elements, modify the entire list of elements and do not modify the individual elements of the list. Further, the use of "may" when describing embodiments of the present invention refers to "one or more embodiments of the present invention."

Figure 1:
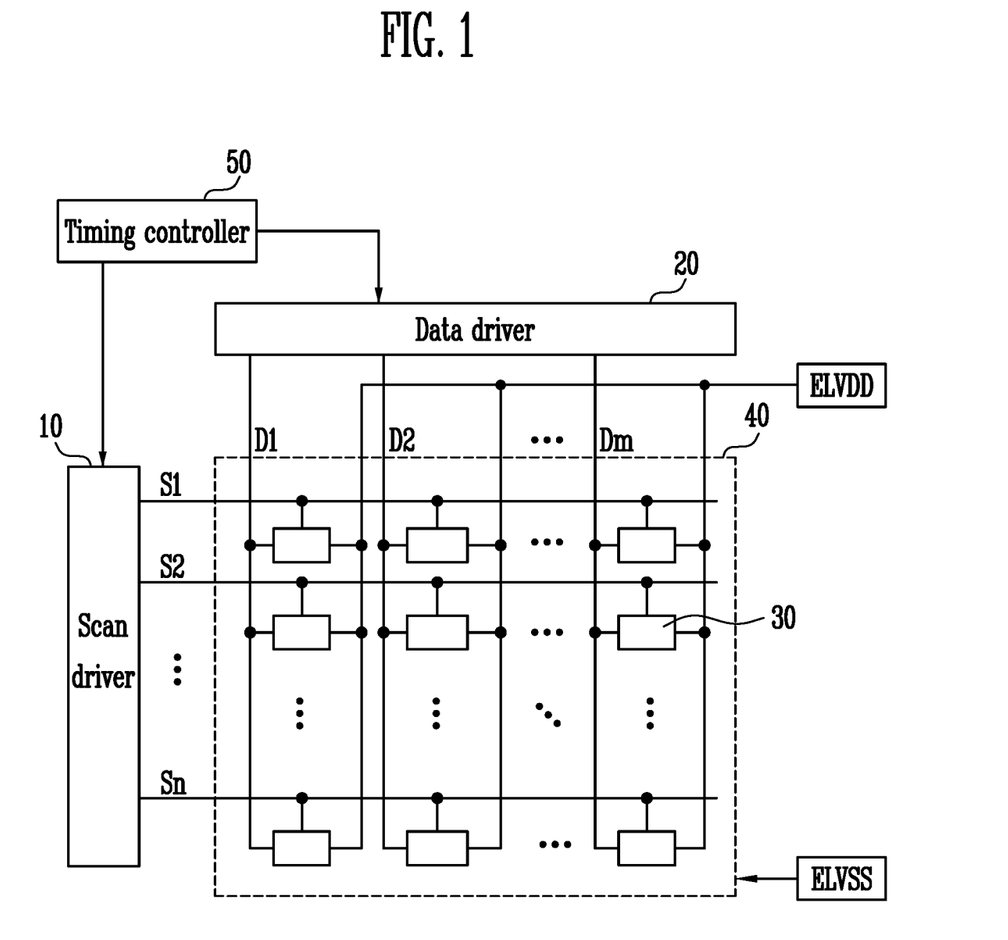
FIG. 1 is a diagram illustrating an organic light emitting display device according to an embodiment of the present invention.

FIG. 1 is a diagram illustrating an organic light emitting display device according to an embodiment of the present invention.

Referring to FIG. 1, the organic light emitting display device according to this embodiment includes a display unit 40 configured to include pixels 30 positioned at crossing regions of scan lines S1 to Sn and data lines D1 to Dm, a scan driver 10 configured to drive the scan lines S1 to Sn, a data driver 20 configured to drive the data lines D1 to Dm, and a timing controller 50 configured to control the scan driver 10 and the data driver 20.

The scan driver 10 supplies scan signals to the scan lines S1 to Sn. For example, the scan driver 10 may progressively supply the scan signals to the scan lines S1 to Sn. To this end, the scan driver 10 includes stage circuits (not shown) respectively coupled to the scan lines S1 to Sn. When the scan signals are progressively supplied to the scan lines S1 to Sn, pixels 30 are selected for each horizontal line.

The data driver 20 supplies data signals to the data lines D1 to Dm in synchronization with the scan signals.

The timing controller 50 controls the scan driver 10 and the data driver 20. The timing controller 50 supplies, to the data driver 20, data (not shown) from the outside of the organic light emitting display.

Each pixel 30 stores a voltage corresponding to the data signal when the scan signal is supplied. The pixel 30 generates light (e.g., light having a predetermined luminance) while controlling the amount of current supplied to an organic light emitting diode (not shown), corresponding to the data signal.

Figure 2:
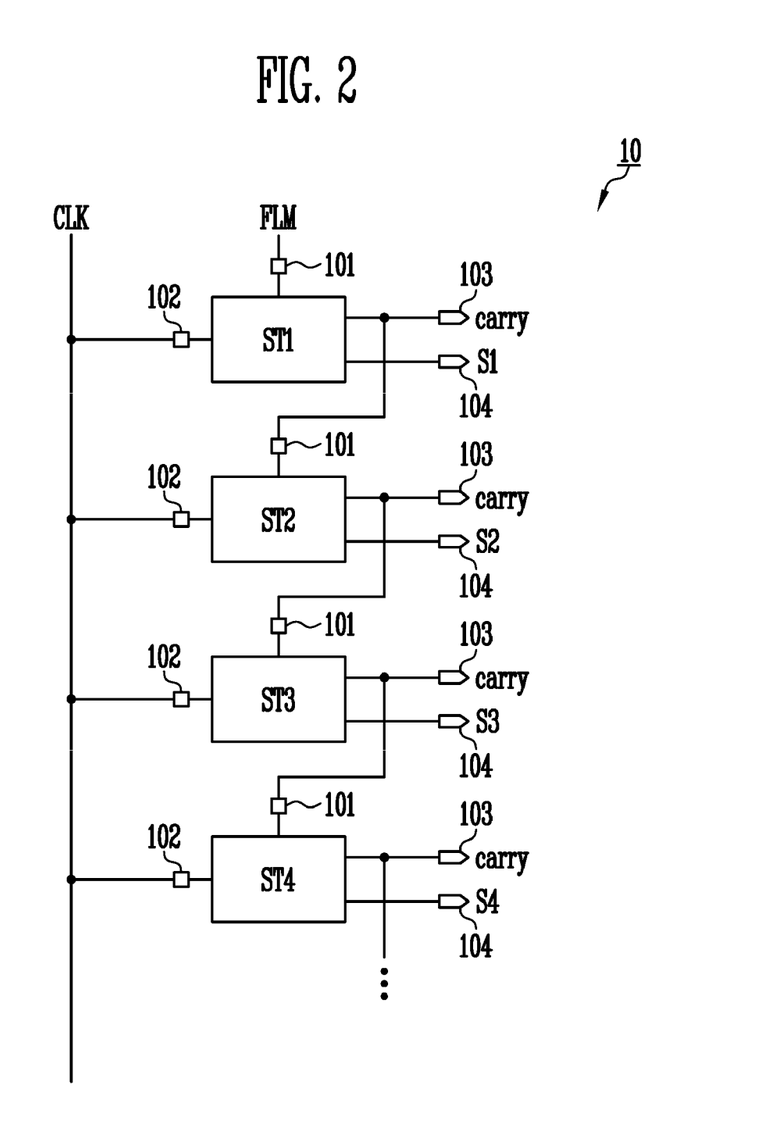
FIG. 2 is a diagram illustrating an embodiment of a scan driver shown in FIG. 1.

FIG. 2 is a diagram illustrating an embodiment of the scan driver shown in FIG. 1. For convenience of illustration, four stages are shown in FIG. 2.

Referring to FIG. 2, the scan driver 10 includes stage circuits ST1 to ST4 respectively coupled to scan lines S1 to S4. The stage circuits ST1 to ST4 each have substantially the same circuit architecture as each other. The stage circuits ST1 to ST4 progressively supply scan signals to the scan lines S1 to S4. Hence, the stage circuits ST1 to STn would progressively supply scan signals to the scan lines S1 to Sn.

Each of the stage circuits ST1 to ST4 is driven by one clock signal CLK. To this end, each of the stage circuits ST1 to ST4 includes a first input terminal 101, a second input terminal 102, a first output terminal 103 and a second output terminal 104.

The first input terminal 101 included in each of the stage circuits ST1 to ST4 receives a carry signal carry of a previous stage or a start signal FLM. For example, the start signal FLM is supplied to the first input terminal 101 of the first stage ST1, and the carry signal carry of the previous stage is supplied to the input terminal 101 of each of the other stage circuits ST2 to ST4.

Figure 4:
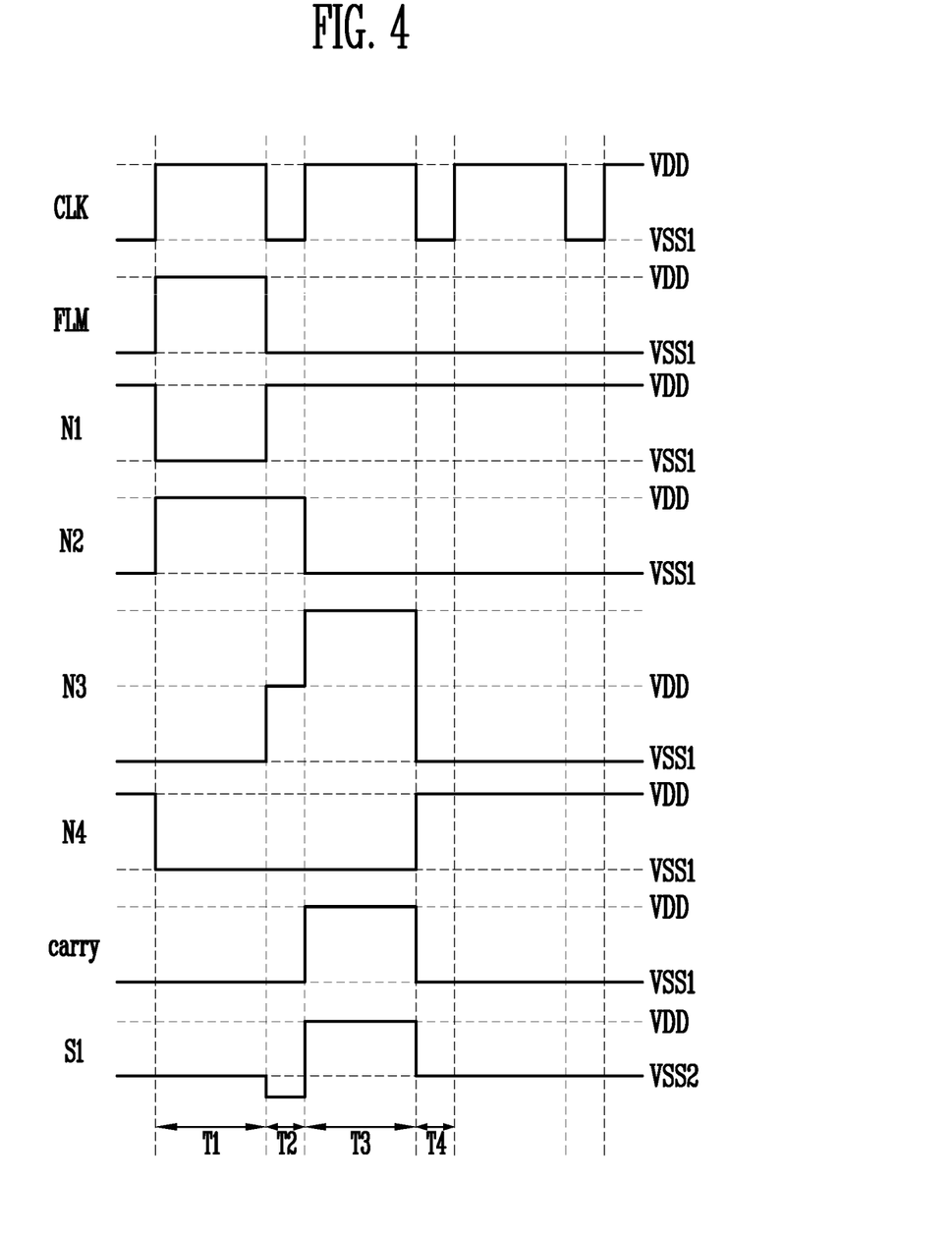
FIG. 4 is a waveform diagram illustrating an embodiment of a driving method of the stage circuit shown in FIG. 3.

The clock signal CLK is supplied to the second input terminal 102 included in each of the stage circuits ST1 to ST4. The clock signal CLK, as shown in FIG. 4, repeats high and low levels, and the supply period of the high level is set longer than that of the low level. For convenience of illustration, the supply of the clock signal CLK refers to when the voltage level (e.g., the high level) is supplied, at which transistors included in the stages ST1 to ST4 are turned on.

A carry signal to be supplied to a next stage is output to the first output terminal 103 included in each of the stage circuits ST1 to ST4, and a scan signal to be supplied to a scan line S is output to the second output terminal 104 included in each of the stage circuits ST1 to ST4.

Figure 3:
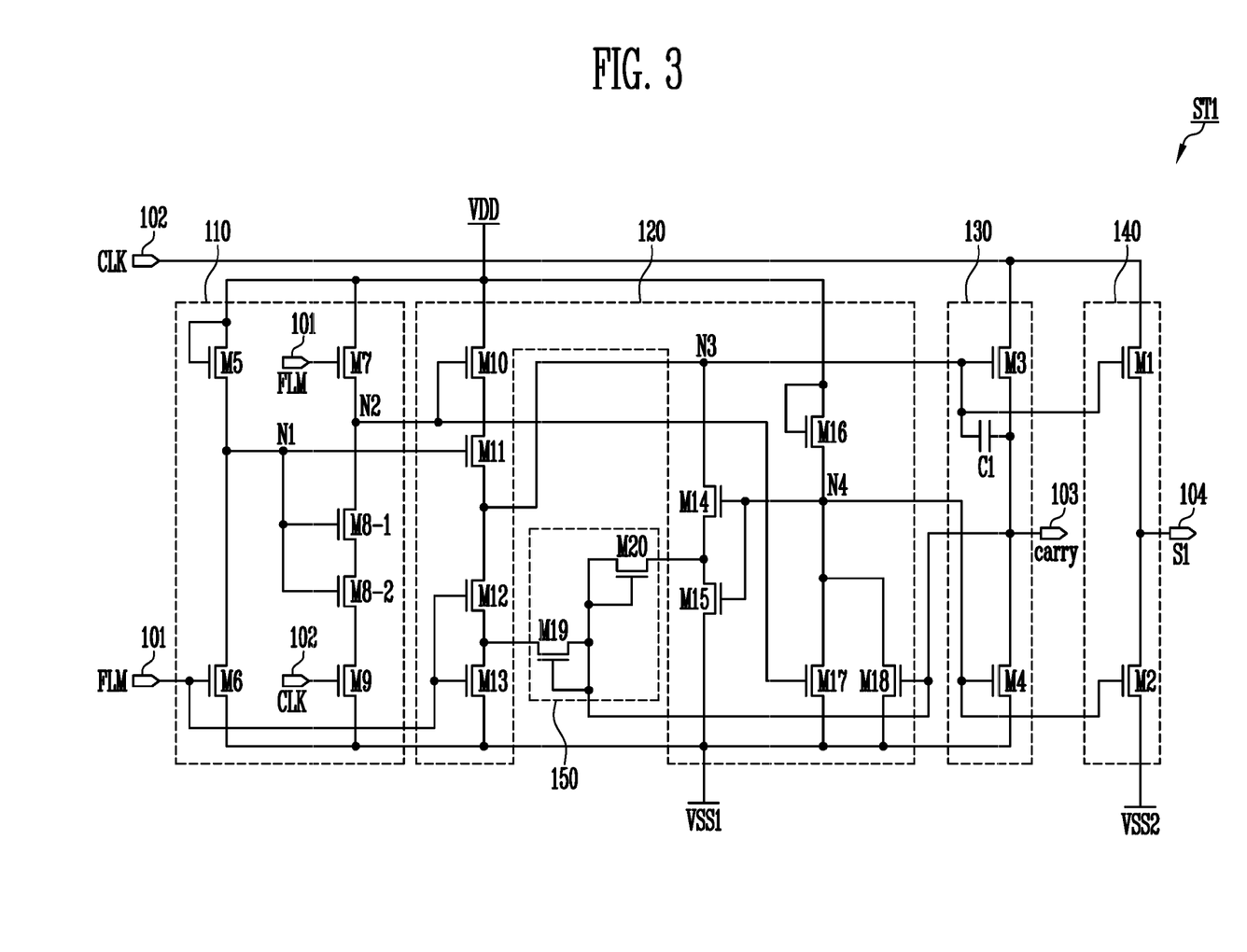
FIG. 3 is a circuit diagram illustrating an embodiment of a stage circuit shown in FIG. 2.

FIG. 3 is a circuit diagram illustrating an embodiment of the stage circuit shown in FIG. 2. For convenience of illustration, the first stage circuit ST1 will be shown in FIG. 3.

Referring to FIG. 3, the stage circuit ST1 according to this embodiment includes a first driver 110, a second driver 120, a first output unit 130, a second output unit 140 and a controller 150. In one embodiment, each of the first driver 110, the second driver 120, the first output unit 130, the second output unit 140 and the controller 150 includes N-type transistors (e.g., NMOS transistors). In other embodiments, other suitable types of transistors (e.g., P-type transistors) may be used.

First and second power sources VSS1 and VSS2 supplied to the stage circuit ST1 are set to a gate-off voltage, and a third power source VDD is set to a gate-on voltage. In this case, the third power source VDD is set to a voltage higher than that of the first or second power source VSS1 or VSS2. In an example embodiment of the present invention, the second power source VSS2 is set to a voltage higher than that of the first power source VSS1.

The second output (unit) 140 outputs a scan signal to the second output terminal 104, corresponding to voltages of third and fourth nodes N3 and N4. To this end, the second output unit 140 includes a first transistor M1 and a second transistor M2.

The first transistor M1 is coupled between the second input terminal 102 and the second output terminal 104. A gate electrode of the first transistor M1 is coupled to the third node N3. The first transistor M1 controls the coupling between the second input terminal 102 and the second output terminal 104, corresponding to (e.g., according to, based on, determined by, or controlled by) the voltage applied to the third node N3.

The second transistor M2 is coupled between the second output terminal 104 and the second power source VSS2. A gate electrode of the second transistor M2 is coupled to the fourth node N4. The second transistor M2 controls the coupling between the second output terminal 104 and the second power source VSS2, corresponding to (e.g., according to, based on, determined by, or controlled by) the voltage applied to the fourth node N4. Here, the second power source VSS2 is set to a voltage higher than that of the first power source VSS1, and hence the second transistor M2 can be stably set to a turn-off state even though the first power source VSS1 is input to the fourth node N4.

The first output unit 130 outputs a carry signal carry to the first output terminal 103, corresponding to (e.g., according to, based on, determined by, or controlled by) the voltages of the third and fourth nodes N3 and N4. To this end, the first output unit 130 includes a third transistor M3, a fourth transistor M4 and a capacitor C1.

The third transistor M3 is coupled between the second input terminal 102 and the first output terminal 103. A gate electrode of the third transistor M3 is coupled to the third node N3. The third transistor M3 controls the coupling between the second input terminal 102 and the first output terminal 103, corresponding to (e.g., according to, based on, determined by, or controlled by) the voltage applied to the third node N3.

The fourth transistor M4 is coupled between the first output terminal 103 and the first power source VSS1. A gate electrode of the fourth transistor M4 is coupled to the fourth node N4. The fourth transistor M4 controls the coupling between the first output terminal 103 and the first power source VSS1, corresponding to (e.g., according to, based on, determined by, or controlled by) the voltage applied to the fourth node N4.

The capacitor C1 is coupled between the third node N3 and the first output terminal 103. The capacitor C1 controls the voltage of the third node N3, corresponding to (e.g., according to, based on, determined by, or controlled by) the voltage of the first output terminal 103.

The first driver 110 controls voltages of first and second nodes N1 and N2. To this end, the first driver 110 includes a fifth transistor M5, a sixth transistor M6, a seventh transistor M7, an eighth transistor M8 and a ninth transistor M9.

The fifth transistor M5 is coupled between the third power source VDD and the first node N1. A gate electrode of the fifth transistor M5 is coupled to the third power source VDD. That is, the fifth transistor M5 is diode-coupled to supply the voltage of the third power source VDD to the first node N1. The fifth transistor M5 is always set to a turn-on state.

The sixth transistor M6 is coupled between the first node N1 and the first power source VSS1. A gate electrode of the sixth transistor M6 is coupled to the first input terminal 101. The sixth transistor M6 is turned on when the start signal FLM is supplied to the first input terminal 101, to allow the first node N1 and the first power source VSS1 to be electrically coupled to each other.

Meanwhile, the first node N1 is electrically coupled to the first power source VSS1 and the third power source VDD during the period in which the sixth transistor M6 is turned on, and therefore, the voltage of the first node N1 may be unstable. Accordingly, in embodiments of the present invention, the fifth transistor M5 is formed to have a channel length longer than that of the sixth transistor M6. For example, the fifth transistor M5 may be formed to have a channel length more than five times longer than that of the sixth transistor M6. Then, the voltage of the first node N1 is dropped to the voltage of the first power source VSS1 during the period in which the sixth transistor M6 is turned on.

The seventh transistor M7 is coupled between the third power source VDD and the second node N2. A gate electrode of the seventh transistor M7 is coupled to the first input terminal 101. The seventh transistor M7 is turned on when the start signal FLM is supplied to the first input terminal 101, to allow the third power source VDD and the second node N2 to be electrically coupled to each other.

The eighth transistor M8 is coupled between the second node N2 and the ninth transistor M9. A gate electrode of the eighth transistor M8 is coupled to the first node N1. The eighth transistor M8 controls the coupling between the second node N2 and the ninth transistor M9, corresponding to (e.g., according to, based on, determined by, or controlled by) the voltage of the first node N1. Meanwhile, the eighth transistor M8 is configured with a plurality of transistors M8-1 and M8-2 coupled in series to each other in order to reduce or minimize leakage current.

The ninth transistor M9 is coupled between the eighth transistor M8 and the first power source VSS1. A gate electrode of the ninth transistor M9 is coupled to the second input terminal 102. The ninth transistor M9 is turned on when the clock signal CLK is supplied to the second input terminal 102, to control the coupling between the eighth transistor M8 and the first power source VSS1.

The second driver 120 controls the voltages of the third and fourth nodes N3 and N4, corresponding to (e.g., according to, based on, determined by, or controlled by) the voltages of the first and second nodes N1 and N2. To this end, the second driver 120 includes a tenth transistor M10, an eleventh transistor M11, a twelfth transistor M12, a thirteenth transistor M13, a fourteenth transistor M14, a fifteenth transistor M15, a sixteenth transistor M16, a seventeenth transistor M17 and an eighteenth transistor M18.

The tenth transistor M10 is coupled between the eleventh transistor M11 and the third power source VDD. A gate electrode of the tenth transistor M10 is coupled to the second node N2. The tenth transistor M10 controls the coupling between the third power source VDD and the eleventh transistor M11, corresponding to (e.g., according to, based on, determined by, or controlled by) the voltage of the second node N2.

The eleventh transistor M11 is coupled between the tenth transistor M10 and the third node N3. A gate electrode of the eleventh transistor M11 is coupled to the first node N1. The eleventh transistor M11 controls the coupling between the tenth transistor M10 and the third node N3, corresponding to (e.g., according to, based on, determined by, or controlled by) the voltage of the first node N1.

The twelfth transistor M12 is coupled between the third node N3 and the thirteenth transistor M13. A gate electrode of the twelfth transistor M12 is coupled to the first input terminal 101. The twelfth transistor M12 is turned on when the start signal FLM is supplied to the first input terminal 101, to allow the third node N3 and the thirteenth transistor M13 to be electrically coupled to each other.

The thirteenth transistor M13 is coupled between the twelfth transistor M12 and the first power source VSS1. A gate electrode of the thirteenth transistor M13 is coupled to the first input terminal 101. The thirteenth transistor M13 is turned on when the start signal FLM is supplied to the first input terminal 101, to allow the twelfth transistor M12 and the first power source VSS1 to be electrically coupled to each other.

The fourteenth transistor M14 is coupled between the third node N3 and the fifteenth transistor M15. A gate electrode of the fourteenth transistor M14 is coupled to the fourth node N4. The fourteenth transistor M14 controls the coupling between the third node N3 and the fifteenth transistor M15, corresponding to (e.g., according to, based on, determined by, or controlled by) the voltage of the fourth node N4.

The fifteenth transistor M15 is coupled between the fourteenth transistor M14 and the first power source VSS1. A gate electrode of the fifteenth transistor M15 is coupled to the fourth node N4. The fifteenth transistor M15 controls the coupling between the fourteenth transistor M14 and the first power source VSS1, corresponding to (e.g., according to, based on, determined by, or controlled by) the voltage of the fourth node N4.

The sixteenth transistor M16 is coupled between the third power source VDD and the fourth node N4. A gate electrode of the sixteenth transistor M16 is coupled to the third power source VDD. That is, the sixteenth transistor M16 is diode-coupled to supply the voltage of the third power source VDD to the fourth node N4. The sixteenth transistor M16 is always set to the turn-on state.

The seventeenth transistor M17 is coupled between the fourth node N4 and the first power source VSS1. A gate electrode of the seventeenth transistor M17 is coupled to the second node N2. The seventeenth transistor M17 controls the coupling between the fourth node N4 and the first power source VSS1, corresponding to (e.g., according to, based on, determined by, or controlled by) the voltage of the second node N2.

The eighteenth transistor M18 is coupled between the fourth node N4 and the first power source VSS1. A gate electrode of the eighteenth transistor M18 is coupled to the first output terminal 103. The eighteenth transistor M18 is turned on when the carry signal carry is supplied to the first output terminal 103, to allow the fourth node N4 and the first power source VSS1 to be electrically coupled to each other.

Meanwhile, the fourth node N4 is electrically coupled to the first and third power sources VSS1 and VDD during the period in which the seventeenth transistor M17 and/or the eighteenth transistor M18 are/is turned on, and therefore, the voltage of the fourth node N4 may be unstable. Accordingly, in embodiments of the present invention, the sixteenth transistor M16 is formed to have a channel length longer than that of the seventeenth or eighteenth transistor M17 or M18. For example, the sixteenth transistor M16 may be formed to have a channel length more than five times longer than that of the seventeenth or eighteenth transistor M17 or M18. Then, the voltage of the fourth node N4 is dropped to the voltage of the first power source VSS1 during the period in which the seventeenth transistor M17 and/or the eighteenth transistor M18 are/is turned on.

The controller 150 reduces or minimizes leakage current of the third node N3 during the period in which the carry signal carry is output, thereby ensuring the reliability of driving. To this end, the controller 150 includes a nineteenth transistor M19 and the twentieth transistor M20.

The nineteenth transistor M19 is coupled between the first output terminal 103 and a common node of the twelfth and thirteenth transistors M12 and M13. A gate electrode of the nineteenth transistor M19 is coupled to the first output terminal 103.

That is, the nineteenth transistor M19 is diode-coupled, and is turned on during the period in which the carry signal carry is output. When the nineteenth transistor M19 is turned on, the common electrode of the twelfth and thirteenth transistors M12 and M13 is set to the voltage of the carry signal carry, and accordingly, the twelfth transistor M12 is completely set to the turn-off state.

The twentieth transistor M20 is coupled between the first output terminal 103 and a common node of the fourteenth and fifteenth transistors M14 and M15. A gate electrode of the twentieth transistor M20 is coupled to the first output terminal 103. That is, the twentieth transistor M20 is diode-coupled, and is turned on during the period in which the carry signal carry is output. When the twentieth transistor M20 is turned on, the common node of the fourteenth and fifteenth transistors M14 and M15 is set to the voltage of the carry signal carry, and accordingly, the fourteenth transistor M14 is completely set to the turn-off state.

FIG. 4 is a waveform diagram illustrating an embodiment of a driving method of the stage circuit shown in FIG. 3.

Referring to FIG. 4, the clock signal repeats high and low levels, and the supply period of the high level is set longer than that of the low level. The start signal FLM supplied to the first stage ST1 is supplied in synchronization with the clock signal CLK (i.e., the start signal FLM is overlapped with the high level of the clock signal).

The operating process of the stage circuit will be described in detail. First, the clock signal CLK and the start signal FLM are supplied during a first period T1.

Figure 5A:
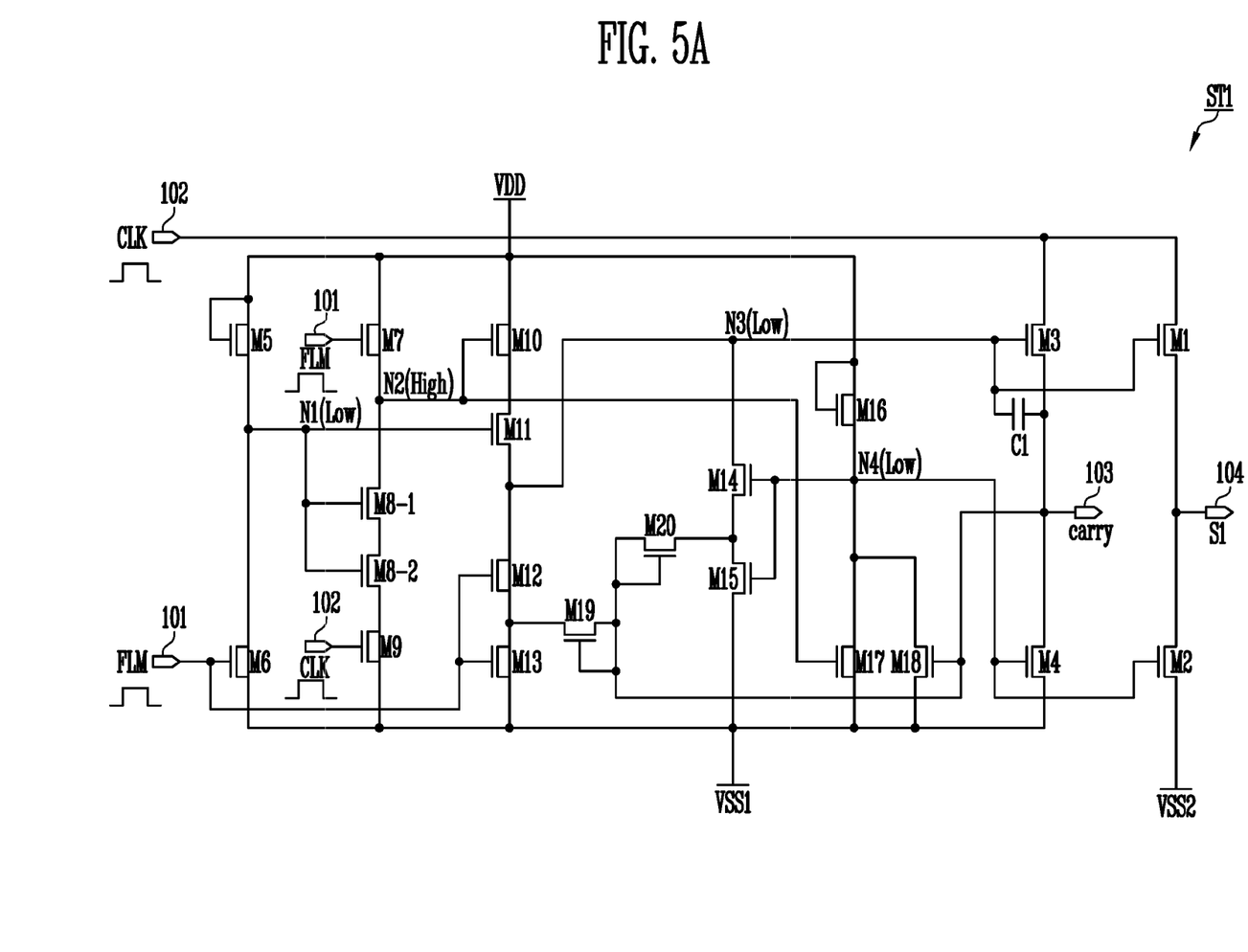
FIGS. 5A to 5D are circuit diagrams illustrating an operating process of a stage, corresponding to the driving waveform of FIG. 4.

When the start signal FLM is supplied, the sixth, seventh, twelfth and thirteenth transistor M13 are turned on as shown in FIG. 5A. When the clock signal CLK is supplied, the ninth transistor M9 is turned on.

When the sixth transistor M6 is turned on, the voltage of the first power source VSS1 is supplied to the first node N1. In this case, the first node N1 is dropped to the voltage of the first power source VSS1, regardless of the turn-on of the fifth transistor M5. When the voltage of the first power source VSS1 is supplied to the first node N1, the eight transistors M8-1 and M8-2 and the eleventh transistor M11 are set to the turn-off state.

When the seventh transistor M7 is turned on, the third power source VDD is supplied to the second node N2. When the third power source VDD is supplied to the second node N2, the tenth and seventeenth transistors M10 and M17 are turned on. When the tenth transistor M10 is turned on, the third power source VDD is supplied to the eleventh transistor M11. In this case, the eleventh transistor M11 is set to the turn-off state, and hence the third power source VDD is not supplied to the third node N3.

When the seventeenth transistor M17 is turned on, the voltage of the first power source VSS1 is supplied to the fourth node N4. In this case, the fourth node N4 is dropped to the voltage of the first power source VSS1, regardless of the turn-on of the sixteenth transistor M16. When the fourth node N4 is dropped to the voltage of the first power source VSS1, the fourteenth, fifteenth, fourth and second transistors M14, M15, M4 and M2 are set to the turn-off state.

When the ninth transistor M9 is turned on, the first power source VSS1 is supplied to the eighth transistor M8-2. In this case, the eighth transistor M8-2 is set to the turn-off state, and hence the first power source VSS1 is not supplied to the second node N2.

When the twelfth and thirteenth transistors M12 and M13 are turned on, the voltage of the first power source VSS1 is supplied to the third node N3. When the voltage of the first power source VSS1 is supplied to the third node N3, the third and first transistors M3 and M1 are set to the turn-off state.

The third and fourth nodes N3 and N4 are set to a low voltage during the first period T1, and accordingly, the first to fourth transistors M1 to M4 are set to the turn-off state. Thus, the first and second output terminals 103 and 104 maintain the low voltage, identical to that in the previous period.

Figure 5B:
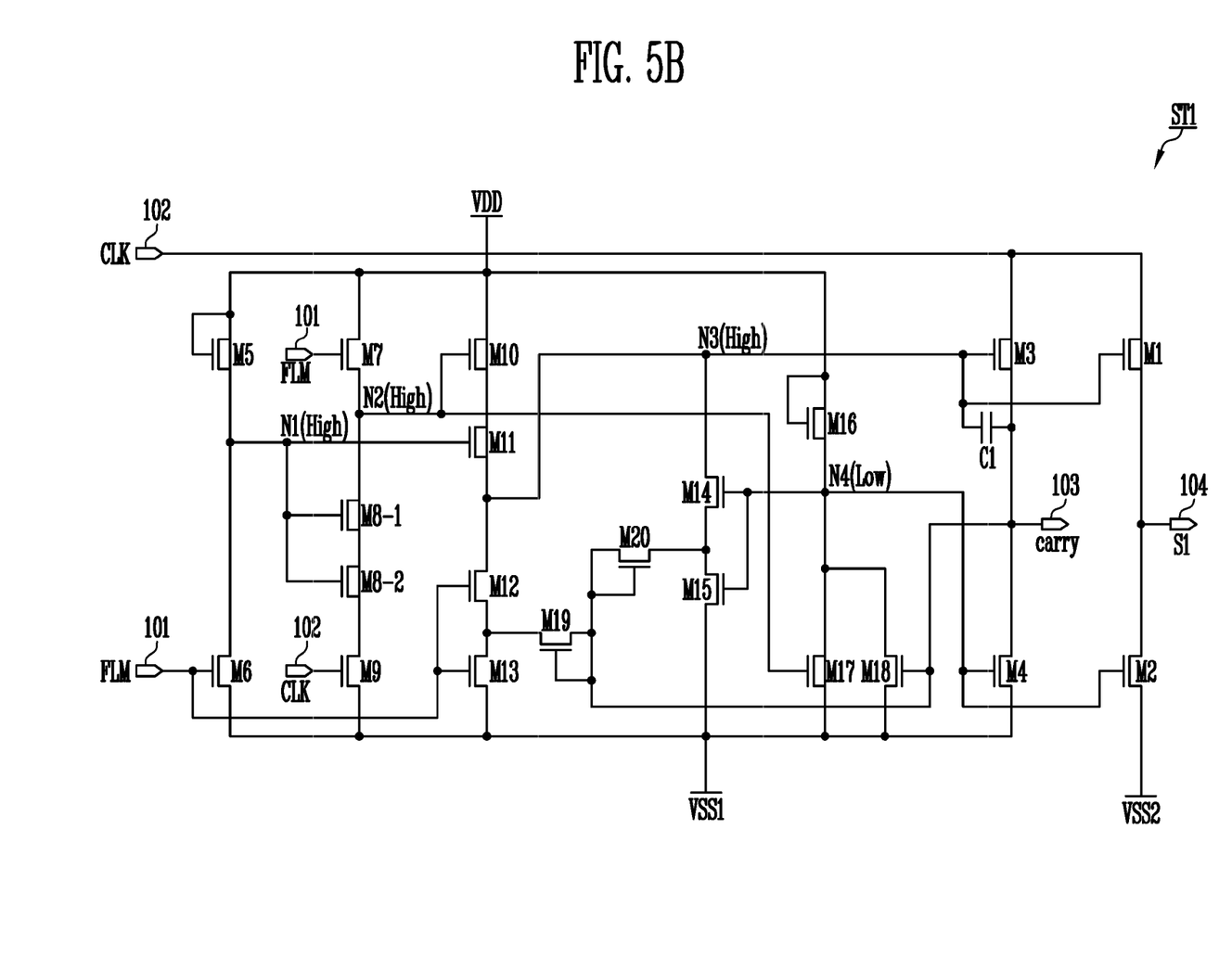

The supply of the clock signal CLK and the start signal FLM is stopped (e.g., the level of the clock signal CLK and the start signal FLM is at a low level) during a second period T2. When the supply of the start signal FLM is stopped (e.g., the level of the start signal FLM is at a low level), the sixth, seventh, twelfth and thirteenth transistors M6, M7, M12 and M13 are turned off as shown in FIG. 5B. When the supply of the clock signal CLK is stopped (e.g., the level of the clock signal CLK is at a low level), the ninth transistor M9 is turned off.

When the sixth transistor M6 is turned off, the voltage of the first node N1 is raised to the voltage of the third power source VDD by the fifth transistor M5. When the voltage of the first node N1 is raised to the voltage of the third power source VDD, the eighth transistors M8-1 and M8-2 and the eleventh transistor M11 are turned on. In this case, the ninth transistor M9 is set to the turn-off state, and hence the second node N2 maintains a high voltage in the previous period, regardless of the turn-on of the eighth transistors M8-1 and M8-2. That is, the second node N2 set to a floating state during the second period T2 maintains the voltage from the previous period by a parasitic capacitor (not shown), etc.

When the eleventh transistor M11 is turned on, the tenth transistor M10 and the third node N3 are electrically coupled to each other. In this case, the tenth transistor M10 is set to the turn-on state, and hence the voltage of the third power source VDD is supplied to the third node N3.

When the voltage of the third power source VDD is supplied to the third node N3, the third and first transistors M3 and M1 are turned on. When the third transistor M3 is turned on, the first output terminal 103 and the second input terminal 102 are electrically coupled to each other. In this case, the clock signal CLK (i.e., the low level) is not supplied to the second input terminal 102, and accordingly, the first output terminal 103 maintains the low voltage.

When the first transistor M1 is turned on, the second output terminal 104 and the second input terminal 102 are electrically coupled to each other. In this case, the clock signal CLK (i.e., the low level) is not supplied to the second input terminal 102, and accordingly, the second output terminal 104 maintains the low voltage.

Meanwhile, the seventeenth transistor M17 is set to the turn-on state during the second period T2, and hence the fourth node N4 maintains the voltage of the first power source VSS1. Thus, the fourteenth, fifteenth, fourth and second transistors M14, M15, M4 and M2 maintain the turn-off state during the second period T2.

Figure 5C:
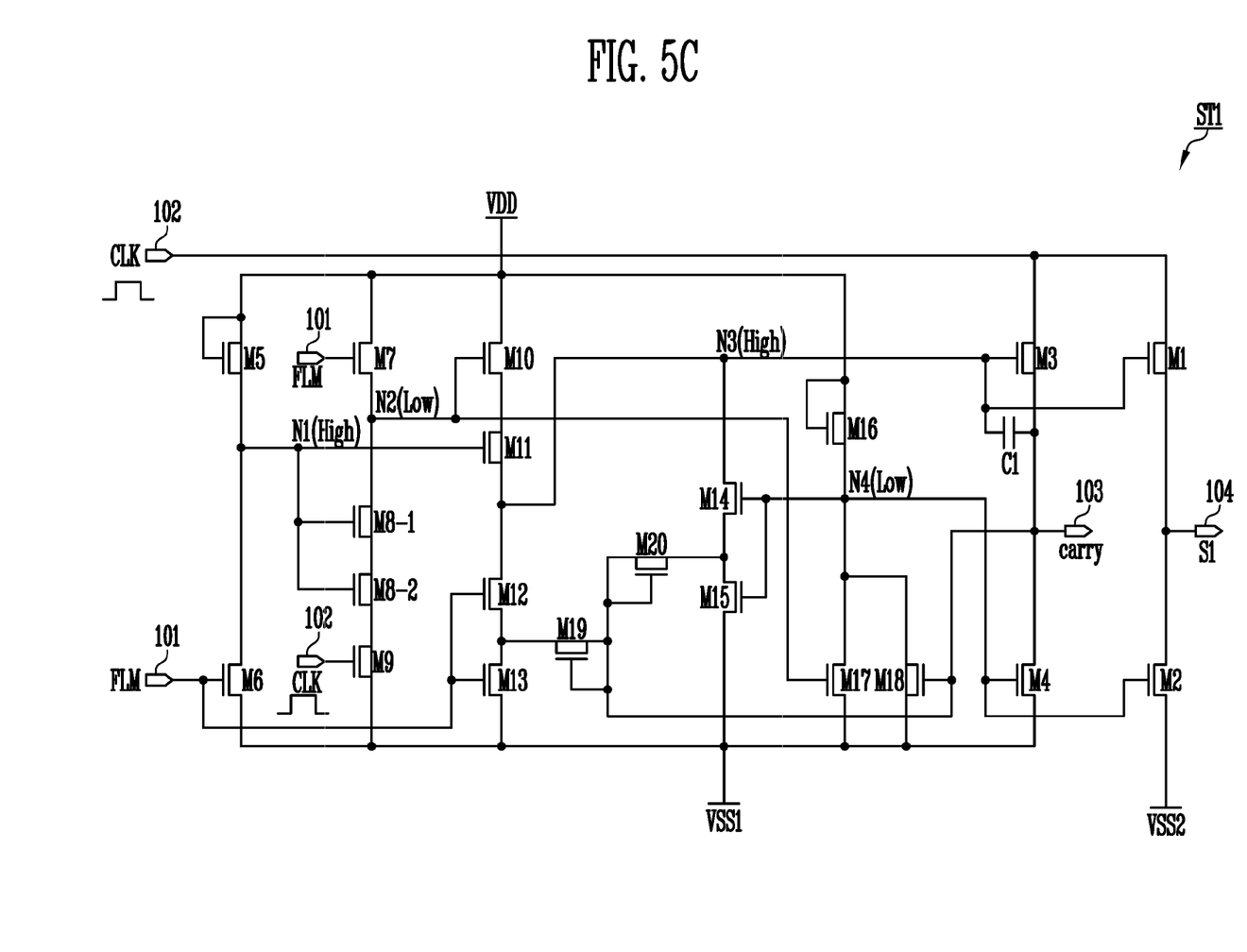

The clock signal CLK is supplied to the second input terminal 102 during a third period T3. When the clock signal CLK is supplied to the second input terminal, the ninth transistor M9 is turned on as shown in FIG. 5C. In this case, the eighth transistor M8 is set to the turn-on state, corresponding to (e.g., according to, based on, determined by, or controlled by) the voltage of the first node N1. Hence, when the ninth transistor M9 is turned on, the voltage of the first power source VSS1 is supplied to the second node N2.

When the voltage of the first power source VSS1 is supplied to the second node N2, the tenth and seventeenth transistors M10 and M17 are turned off. When the tenth transistor M10 is turned off, the first transistor M11 and the third power source VDD are not electrically coupled to each other. Thus, although the eleventh transistor M11 is set to the turn-on state, the voltage of the third power source VDD is not supplied to the third node N3. That is, the third node N3 is set to the floating state during the third period T3.

Meanwhile, the third node N3 is set to the high voltage, and hence the first and third transistors M1 and M3 maintain the turn-on state during the third period T3. When the third transistor M3 is turned on, the clock signal CLK supplied to the second input terminal 102 is supplied to the first output terminal 103. In this case, the voltage of the third node N3 is raised by the coupling of the capacitor C1, and accordingly, the third transistor M3 stably maintains the turn-on state. The clock signal CLK supplied to the first output terminal 103 is output as the carry signal carry to the next stage.

Meanwhile, when the carry signal carry is output to the first output terminal 103, the nineteenth and twentieth transistors M19 and M20 are turned on. When the nineteenth transistor M19 is turned on, the high voltage (i.e., the carry signal) is supplied to a common node of the twelfth and thirteenth transistors M12 and M13. In this case, the low voltage from the first input terminal 101 is supplied to the gate electrode of the twelfth transistor M12, and accordingly, the twelfth transistor M12 is completely set to the turn-off state. When the twelfth transistor M12 is completely set to the turn-off state, the leakage current from the third node N3 is reduced or minimized, and accordingly, the third node N3 can stably maintain the high voltage.

Similarly, when the twentieth transistor M20 is turned on, the high voltage is supplied to a common node of the fourteenth and fifteenth transistors M14 and M15. Then, the fourteenth transistor of which gate electrode receives the low voltage is completely set to the turn-off state, and accordingly, the leakage current from the third node N3 can be reduced or minimized.

When the first transistor M1 is turned on, the clock signal CLK is supplied to the second output terminal 104. The clock signal CLK supplied to the second output terminal 104 is supplied as the scan signal to the scan line S1.

Figure 5D:
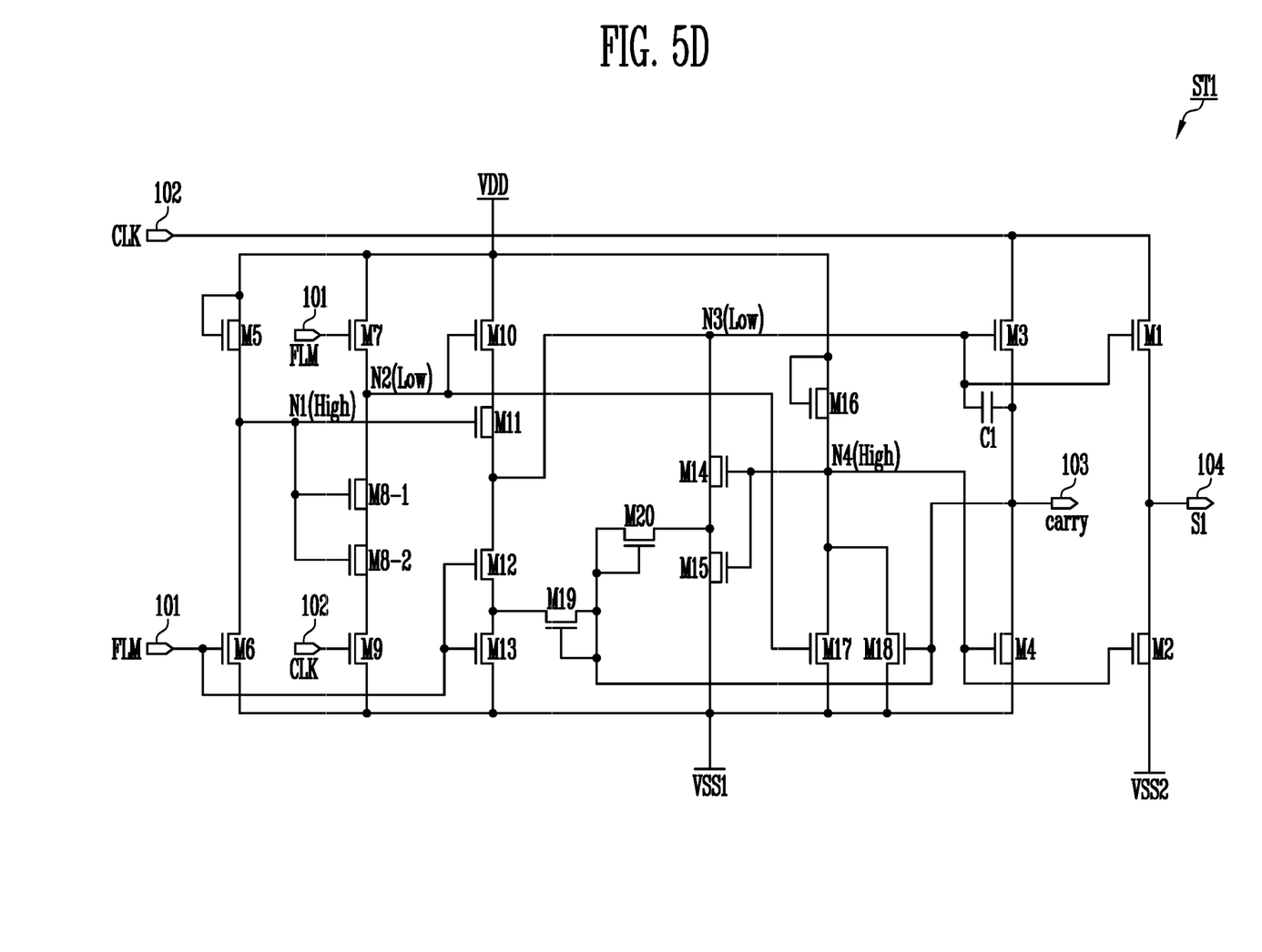

The supply of the clock signal CLK is stopped (e.g., the level of the clock signal CLK is at a low level) during a fourth period T4. When the supply of the clock signal CLK is stopped (e.g., the level of the clock signal CLK is at a low level), the ninth transistor M9 is turned off as shown in FIG. 5D. When the ninth transistor M9 is turned off, the eighth transistor M8 and the first power source VSS1 are electrically decoupled from each other. In this case, the first node N1 maintains the high voltage, and the second node N2 maintains the low voltage in the previous period T3.

Meanwhile, the supply of clock signal CLK is stopped (e.g., the level of the clock signal CLK is at a low level), the low voltage is supplied to the first output terminal 103, and the voltage of the third node N3 set to the floating state by the coupling of the capacitor C1 is approximately dropped to the voltage of the third power source VDD. When the low voltage is supplied to the first output terminal 103, the eighteenth, nineteenth and twentieth transistors M18, M19 and M20 are turned off.

The eighteenth transistor M18 is set to the turn-off state, and the voltage of the fourth node N4 is raised to the voltage of the third power source VDD by the sixteenth transistor M16. When the fourth node N4 is set to the voltage of the third power source VDD, the fourteenth, fifteenth, fourth and second transistors M14, M15, M4 and M2 are turned on.

When the fourteenth and fifteenth transistors M14 and M15 are turned on, the first power source VSS1 is supplied to the third node N3, and accordingly, the third and first transistors M3 and M1 are turned off. When the fourth transistor M4 is turned on, the voltage of the first power source VSS1 is output to the first output terminal 103 (i.e., the supply of the carry signal carry is stopped (e.g., the level of the carry signal carry is at a low level)). When the second transistor M2 is turned on, the voltage of the second power source VSS2 is output to the second output terminal 104 (i.e., the supply of the scan signal is stopped (e.g., the level of the scan signal is at a low level)).

The stage circuits of embodiments of the present invention progressively supply the scan signal to the scan lines S1 to Sn by repeating the aforementioned process. In embodiments of the present invention, the stages are driven using only one clock signal CLK, and hence the number of signal lines can be reduced or minimized. Accordingly, it is possible to reduce or minimize the power consumption and the mounting area of the signal lines.

Further, in embodiments of the present invention, leakage current can be reduced or minimized using the controller 150, and accordingly, it is possible to secure the reliability of driving. Additionally, in embodiments of the present invention, the leakage current in the second output unit 140 can be reduced or minimized using the second power source VSS2 higher than the first power source VSS1. In embodiments of the present invention, the carry signal is output from the first output unit 130, and the scan signal is output from the second output unit 140. In this case, the load of the first and second output units 130 and 140 is distributed, and accordingly, it is possible to ensure the reliability of driving.

Figure 6:
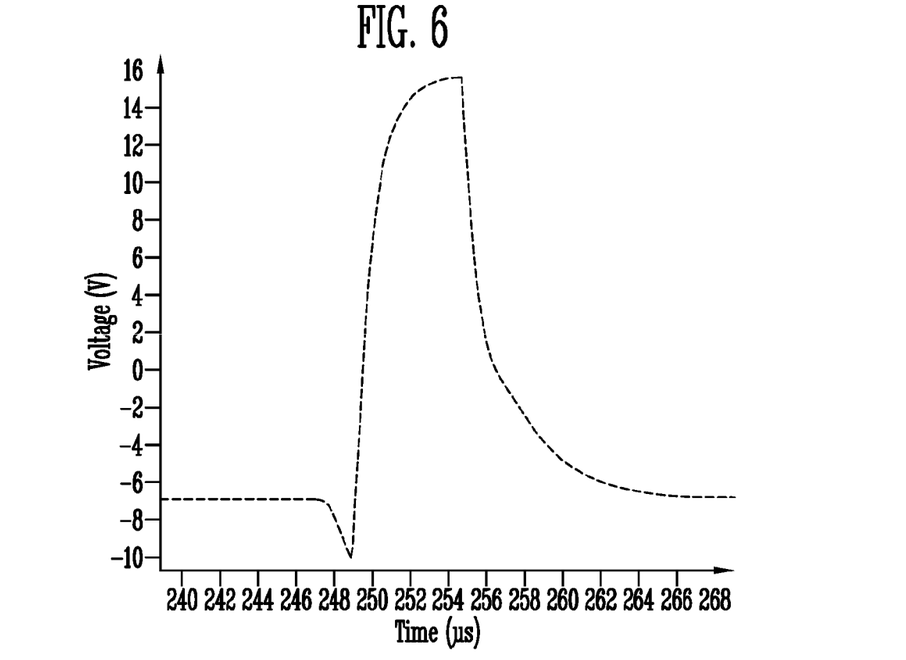
FIG. 6 is a graph illustrating a simulation result of a stage, corresponding to a driving frequency.

FIG. 6 is a graph illustrating a simulation result of a stage, corresponding to a driving frequency.

Referring to FIG. 6, the stage circuit of the embodiments of present invention stably outputs the scan signal at a high driving frequency of 122.88 kHz. Thus, the stage circuit of embodiments of the present invention can be applied to a display device that requires a high driving frequency.

Figure 7:
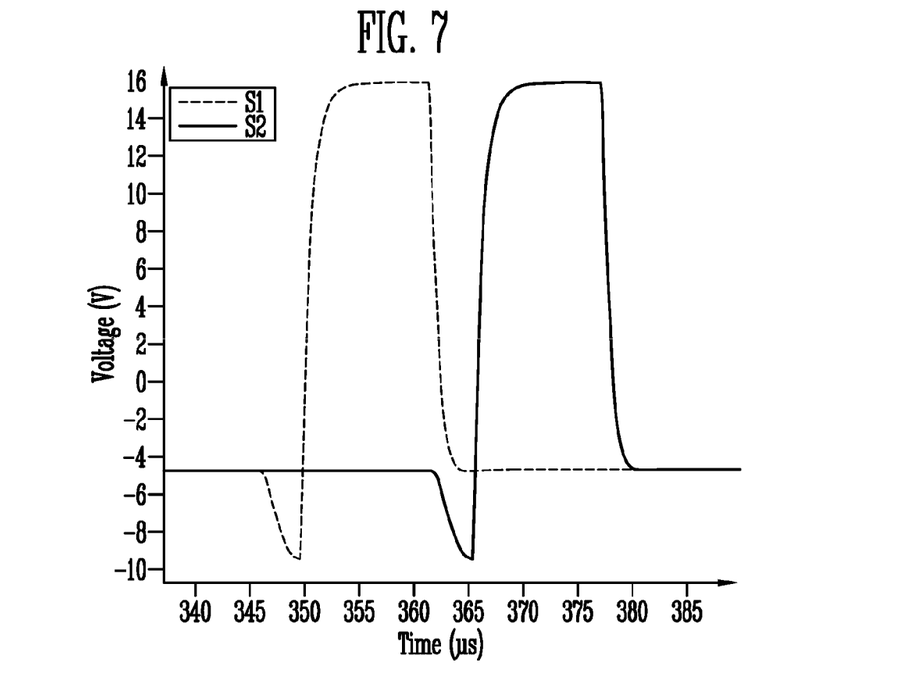
FIG. 7 is a graph illustrating a simulation result of the stage circuit according to embodiments of the present invention.

FIG. 7 is a graph illustrating a simulation result of the stage circuit of embodiments of the present invention.

Referring to FIG. 7, the stage circuits of embodiments of the present invention stably output the scan signal. That is, the transistors included in the stages of embodiments of the present invention are completely set to the turn-off state, and accordingly, it is possible to stably output the scan signal.

Meanwhile, in the embodiments described above, the scan driver has been described using the organic light emitting display, but embodiments of the present invention are not limited thereto. Actually, the scan driver of embodiments of the present invention can be applied to various display devices including the scan lines S1 to Sn.

By way of summation and review, an organic light emitting display device includes a data driver configured to supply data signals to data lines, a scan driver configured to supply scan signals to scan lines, and a display unit including a plurality of pixels coupled to the scan lines and the data lines.

Pixels included in the display unit are selected when a scan signal is supplied to a scan line, to receive a data signal from a data line. The pixels receiving the data signal generate light with a predetermined luminance corresponding to the data signal, thereby displaying an image.

Meanwhile, the scan driver includes stage circuits respectively couple to the scan lines. Each stage circuit includes a plurality of transistors configured to supply scan signals to the scan lines. P-type (e.g., PMOS) or N-type (e.g., NMOS) transistors constituting the stage circuit may be concurrently or simultaneously formed with pixels. In this case, it is possible to reduce the manufacturing cost of the organic light emitting display device, etc.

However, in a case where the stage circuit is implemented with N-type transistors, the transistors may be not completely turned off due to the Vth shift of the transistors, and therefore, malfunction of the transistors may occur. Actually, in the N-type transistors, the Vth is negatively shifted, and accordingly, there occurs a case where the transistors are not turned off even in a state in which the voltage Vgs between gate and source electrodes of the transistors becomes 0V (i.e., Vgs=0V).

In the stage circuit and the scan driver using the same according to embodiments of the present invention, it is possible to reduce or minimize leakage current in the output unit, using a first power source and a second power source higher than the first power source. Further, in some embodiments of the present invention, some transistors are completely turned off using the controller during the period in which the carry signal is supplied. Accordingly, it is possible to ensure the reliability of driving. Additionally, the stage circuit of embodiments of the present invention is driven using one clock signal. Accordingly, it is possible to reduce or minimize the number of signal lines, to reduce power consumption of the signal lines and to decrease the mounting area of the signal lines.

Example embodiments have been disclosed herein, and although specific terms are employed, they are used and are to be interpreted in a generic and descriptive sense only and not for purpose of limitation. In some instances, as would be apparent to one of ordinary skill in the art at the time of filing the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of embodiments of the present invention as set forth in the following claims, and their equivalents.

What is claimed is:

1. A stage circuit, comprising:
a first driver configured to control voltages of first and second nodes, according to a first power source, a third power source, a start signal or a carry signal of a previous stage input to a first input terminal, and a clock signal supplied to a second input terminal;
a second driver configured to control voltages of third and fourth nodes, according to voltages of the first power source, the third power source, the first input terminal and the first and second nodes;
a first output unit configured to output a carry signal to a first output terminal, according to voltages of the first power source, the second input terminal and the third and fourth nodes;
a second output unit configured to output a scan signal to a second output terminal, according to voltages of a second power source, the second input terminal and the third and fourth nodes; and
a controller electrically coupled to the first output terminal and the second driver.

2. The stage circuit of claim 1, wherein the first driver, the second driver, the first output unit, the second output unit and the controller comprise N-type transistors.

3. The stage circuit of claim 1, wherein the first and second power sources have a gate-off voltage, and the third power source has a gate-on voltage.

4. The stage circuit of claim 3, wherein the second power source has a voltage higher than that of the first power source.

5. The stage circuit of claim 1, wherein the second output unit comprises:

a first transistor coupled between the second input terminal and the second output terminal, the first transistor comprising a gate electrode coupled to the third node; and a second transistor coupled between the second output terminal and the second power source, the second transistor comprising a gate electrode coupled to the fourth node.

6. The stage circuit of claim 1, wherein the first output unit comprises:

a first transistor coupled between the second input terminal and the first output terminal, the first transistor comprising a gate electrode coupled to the third node;

a second transistor coupled between the first output terminal and the first power source, the second transistor comprising a gate electrode coupled to the fourth node; and a capacitor coupled between the first output terminal and the third node.

7. The stage circuit of claim 1, wherein the first driver comprises:

a first transistor coupled between the third power source and the first node, the first transistor comprising a gate electrode coupled to the third power source;

a second transistor coupled between the first node and the first power source, the second transistor comprising a gate electrode coupled to the first input terminal;

a third transistor coupled between the third power source and the second node, the third transistor comprising a gate electrode coupled to the first input terminal;

an fourth transistor coupled between the second node and a fifth transistor, the fourth transistor comprising a gate electrode coupled to the first node; and the fifth transistor coupled between the fourth transistor and the first power source, the fifth transistor comprising a gate electrode coupled to the second input terminal.

8. The stage circuit of claim 7, wherein the first transistor has a channel length longer than that of the second transistor.

9. The stage circuit of claim 7, wherein the fourth transistor comprises a plurality of transistors coupled in series.

10. The stage circuit of claim 1, wherein the second driver comprises:

a first transistor coupled between the third power source and a second transistor, the first transistor comprising a gate electrode coupled to the second node;

the second transistor coupled between the first transistor and the third node, the second transistor comprising a gate electrode coupled to the first node;

a third transistor coupled between the third node and a fourth transistor, the third transistor comprising a gate electrode coupled to the first input terminal;

the fourth transistor coupled between the third transistor and the first power source, the fourth transistor comprising a gate electrode coupled to the first input terminal;

a fifth transistor coupled between the third node and a sixth transistor, the fifth transistor comprising a gate electrode coupled to the fourth node;

the sixth transistor coupled between the fifth transistor and the first power source, the sixth transistor comprising a gate electrode coupled to the fourth node;

a seventh transistor coupled between the third power source and the fourth node, the seventh transistor comprising a gate electrode coupled to the third power source;

an eight transistor coupled between the fourth node and the first power source, the eight transistor comprising a gate electrode coupled to the second node; and a ninth transistor coupled between the fourth node and the first power source, the ninth transistor comprising a gate electrode coupled to the first output terminal.

11. The stage circuit of claim 10, wherein the seventh transistor has a channel length longer than that of the eighth or ninth transistor.

12. The stage circuit of claim 10, wherein the controller comprises:

a tenth transistor coupled between the first output terminal and a common node of the third and fourth transistors, and the tenth transistor comprising a gate electrode coupled to the first output terminal; and an eleventh transistor coupled between the first output terminal and a common node of the fifth and sixth transistors, and the eleventh transistor comprising a gate electrode coupled to the first output terminal.

13. The stage circuit of claim 1, wherein the controller allows at least one transistor included in the second driver to be completely turned off during a period in which the carry signal is supplied.

* * * * *